(12) United States Patent
Barclay et al.

(10) Patent No.: US 7,390,608 B2
(45) Date of Patent: Jun. 24, 2008

(54) PHOTORESISTS CONTAINING SI-POLYMERS

(75) Inventors: George G. Barclay, Jefferson, MA (US); Subbareddy Kanagasabapathy, Worcester, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/690,217

(22) Filed: Oct. 21, 2003

(65) Prior Publication Data

US 2004/0209187 A1   Oct. 21, 2004

Related U.S. Application Data

(60) Provisional application No. 60/420,056, filed on Oct. 21, 2002.

(51) Int. Cl.
| | |
|---|---|
| *G03C 1/725* | (2006.01) |
| *G03C 1/73* | (2006.01) |
| *G03F 7/039* | (2006.01) |
| *G03F 7/09* | (2006.01) |
| *G03F 7/20* | (2006.01) |
| *G03F 7/30* | (2006.01) |

(52) U.S. Cl. .................... 430/270.1; 430/326; 430/905; 430/907; 430/271.1; 430/272.1; 430/311

(58) Field of Classification Search ............. 430/270.1, 430/325, 326, 905, 907
See application file for complete search history.

(56) References Cited

U.S. PATENT DOCUMENTS

| | | | |
|---|---|---|---|
| 2,986,548 A | 5/1961 | McLoughlin et al. ....... 524/319 |
| 3,389,114 A | 6/1968 | Burzynski et al. ........... 523/309 |
| 3,969,543 A | 7/1976 | Roberts et al. .............. 430/325 |
| 4,223,121 A | 9/1980 | Burzynski ................... 528/12 |
| 4,349,609 A | 9/1982 | Takeda et al. ............... 428/429 |
| 4,399,266 A | 8/1983 | Matsumura et al. .......... 528/10 |
| 4,745,169 A | 5/1988 | Sugiyama et al. ............. 528/43 |
| 4,831,174 A | 5/1989 | Elms .......................... 556/451 |
| 5,100,503 A | 3/1992 | Allman et al. ............... 438/694 |
| 5,113,003 A | 5/1992 | Woods et al. ................ 556/432 |
| 5,240,813 A | 8/1993 | Watanabe et al. ......... 430/280.1 |
| 5,547,808 A | 8/1996 | Watanabe .................... 430/176 |
| 5,612,170 A | 3/1997 | Takemura et al. ......... 430/270.1 |
| 5,691,396 A | 11/1997 | Takemura et al. ............. 522/62 |
| 5,731,126 A | 3/1998 | Takemura et al. ........ 430/270.1 |
| 5,882,844 A | 3/1999 | Tsuchiya et al. ......... 430/288.1 |
| 5,972,560 A | 10/1999 | Kaneko et al. ........... 430/270.1 |
| 6,087,064 A | 7/2000 | Lin et al. ................. 430/270.1 |
| 6,150,488 A | 11/2000 | Martin ........................ 528/34 |
| 6,210,856 B1 | 4/2001 | Lin et al. ................. 430/270.1 |
| 6,309,796 B1 | 10/2001 | Nakashima et al. ....... 430/287.1 |
| 6,342,562 B1 | 1/2002 | Kozawa et al. .............. 524/588 |
| 6,406,828 B1 | 6/2002 | Szmanda et al. .......... 430/270.1 |
| 6,420,084 B1 | 7/2002 | Angelopoulos et al. .. 430/270.1 |
| 6,420,088 B1 | 7/2002 | Angelopoulos et al. .. 430/272.1 |
| 2002/0090572 A1 | 7/2002 | Sooriyakumaran et al. ....................... 430/271.1 |
| 2003/0219676 A1 | 11/2003 | Barclay et al. ........... 430/270.1 |
| 2003/0224286 A1 * | 12/2003 | Barclay et al. ........... 430/270.1 |
| 2004/0161698 A1 | 8/2004 | Kanagasabapathy et al. ..... 430/270.1 |

FOREIGN PATENT DOCUMENTS

| | | |
|---|---|---|
| JP | 2001-040092 A2 | 2/2001 |
| JP | 2001-040283 A2 | 2/2001 |
| WO | WO 02/091083 A1 | 11/2002 |

* cited by examiner

*Primary Examiner*—Sin Lee
(74) *Attorney, Agent, or Firm*—Peter F. Corless; Darryl P. Frickey; Edwards Angell Palmer Dodge LLP

(57) ABSTRACT

In a first aspect, silicon polymers are provided that have controlled ratio of silanol (Si—OH) moieties:Si atoms and/or a controlled amount of alkaline aqueous-solubilizing groups. Si-polymers of the invention are particularly useful as a photoresist resin component. In a further aspect, halogenated sulfonamide and thiol compounds and Si-containing polymers comprising such reacted monomers are provided.

17 Claims, No Drawings

PHOTORESISTS CONTAINING SI-POLYMERS

This application claims the benefit of U.S. Provisional Application(s) No(s).: 60/420,056 Oct. 21, 2002

BACKGROUND

1. Field of the Invention

The present invention relates generally to photoimageable compositions. In particular, in a first aspect, the present invention relates to photoimageable compositions that contain Si-polymers that have a specified silanol content and/or specified content of alkaline aqueous-solubilizing groups. In a further aspect, new halogenated sulfonamide and thiol compounds and Si-containing polymers comprising such compounds are provided.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

The increasing density of integrated circuits has created a need for higher resolution patterning capabilities. One method of improving resolution involves using a shorter wavelength light during pattern formation. Shorter wavelengths of approximately 200 to 280 nm may be obtained by using a deep UV ("DUV") source such as a mercury/xenon ("Hg/Xe") lamp with appropriate filters. Additionally, KrF (248 nm) or ArF (193 nm) excimer lasers may be used as exposure sources.

In addition to using shorter wavelengths during exposure, it is also desirable to use a thinner layer of resist. However, the major drawback of using a thin layer of resist is that the variation of resist thickness over a diffusion step on a substrate and into an etched pattern increases as the pattern size becomes smaller. This variation means that the dimensions of any pattern being imaged in the resist will vary as the step geometry is traversed. Therefore, in a single layer resist system, the lack of dimensional control on the wafer can create different line widths throughout the resist which reduces the quality of the electronic package.

To attempt to improve dimensional control, bilayer (or bilevel or multilevel) resist systems have been utilized. In a typical bilevel system, a bottom resist is first applied to a substrate to planarize wafer topography. The bottom resist is cured and a second thinner imaging top resist is then applied over the bottom resist. The top resist is then soft baked, and patterned (or imaged) using conventional resist exposure and development, followed by etch transfer of the top pattern through the bottom resist using the top resist pattern as an etch mask. Positive resists are commonly used in bilayer applications and are typically based on novolac resins, which are condensation polymers of phenols or substituted phenols and formaldehyde. See, generally, Sugiyama et al., *Positive Excimer Laser Resists Prepared with Aliphatic Diazoketones*, Soc. Plastics Eng., Conference Proceedings, pages 51-60 (November 1988); and U.S. Pat. Nos. 4,745,169; 5,338,818; 5,619,396; 5,731,126; 6,296,985; and 6,340,734.

SUMMARY OF THE INVENTION

We have now provide new Si-polymers and photoresists that comprise such polymers.

In a first aspect of the invention, Si-polymers are provided which are characterized in part as having a specified silanol content, i.e. a specified ratio of hydroxy groups to Si atoms in the polymer. As referred to herein, a silanol group is a hydroxy group that is directly (no other intervening atoms) covalently linked to a Si atom.

In a further aspect, the Si-polymers of the invention have a specified content or amount of aqueous-base solubilizing groups, i.e. polymer units that can facilitate dissolution of the polymer in aqueous alkaline solutions (photoresist developers). Exemplary preferred aqueous-base solubilizing groups include halogenated alcohols particularly fluorinated alcohols such as hexafluoropropyl alcohol; sulfonamides including substituted sulfonamides such as halide-substituted sulfonamides particularly fluorinated sulfonamides (e.g. —$NHSO_2CF_3$); carboxylic acids including substituted carboxylic acids such as halogenated carboxylic acids particularly a fluorinated carboxylic acid e.g. a moiety of the formula —$CF_2COOH$; phenolic groups including ring-substituted phenolic groups; thiol groups; and the like.

In particularly preferred aspects of the invention, photoresists and Si-polymers are provided that have both a controlled silanol:Si atom ratio as well as controlled concentration of aqueous base-solubilizing groups.

We have surprisingly found that such control of the silanol:Si atom ratio and/or the aqueous base-solubilizing groups concentration can impart significantly enhanced lithographic performance to a photoresist containing such a Si-polymer, including formation of a photoresist relief image of improved resolution.

Preferred polymers of the invention have a ratio of the number of silanol (OH) groups to Si atoms of from about 0.01 to about 1.5; more preferably from about 0.05 or 0.1 to about 1 silanol (OH) groups per Si atom; still more preferably about 0.1 to about 0.8 silanol (OH) groups per Si atom. Preferred polymers also include those that have a ratio of silanol (OH) groups to Si atoms of from about 0.1 to about 0.7, 0.6, 0.5, 0.4 or even about 0.3. Particularly preferred polymers include those have a ratio of silanol (OH) groups to Si atoms of from 0.1 or 0.15 to 0.2, 0.25, 0.3 or 0.4. Typically preferred Si-polymers of the invention contain some amount of silanol (OH) groups, e.g. at least about 0.01 silanol (OH) groups per Si atoms in the polymer, more preferably 0.05, 0.1 or 0.15 OH groups per Si atom.

We also have found that preferred or optimal silanol:Si atom also can vary with particular polymers and photoresists. For example, for a resist polymer that has a high content of aqueous base-solublizing groups, e.g. where greater than 60, 70 or 80 percent of the total repeat units of the polymer have aqueous base-solubilizing groups, it can be desirable to have a relative lower amount of silanol content in the polymer, e.g. a silanol:Si atom ratio of no greater than about 0.5, or even less such as a silanol:Si atom ratio of no greater than about 0.45, 0.4, 0.3 or 0.25. In general, to provide enhanced photoresist resolution, as the content of hydrophilic or otherwise polar groups of a polymer increases, the optimal maximum silanol content of the polymer may suitably decrease.

It should be understood that the silanol:Si atom ratios designate herein the total number of silanol (OH) groups with respect to the total number of Si atoms in the specified polymer. That is, the silanol atom:Si atom ratios referred to herein are numerical ratios of the ration of the total number of the specified OH groups (i.e. silanol groups) with respect to the total number of Si atoms in a polymer.

The ratio of silanol (OH) groups to Si atoms can be determined by any of a number of suitable analytical methods. NMR is a preferred method to assess silanol content. $^{29}$Si NMR is a preferred method to assess silanol:Si atom ratios of a particularly polymer, and designation of such ratios herein are understood to refer to determination of the specified ratio by $^{29}$Si NMR analysis of the polymer.

Preferred polymers of the invention may contain aqueous-base solubilizing groups in an amount of at least about 20 mole percent based on total units of the Si-polymer, more preferably at least about 30, 35, 40, 45, 50, 55, 60, 65 or 70 mole percent of aqueous-base solubilizing groups such as a fluorinated alcohol based on total units of a Si-polymer. For many applications, preferred polymers will contain aqueous-base solubilizing groups in amount of from about 40 to about 95 mole percent based on total units of the Si-polymer; and for many application more preferred will be polymers that contain base-solubilizing groups in an amount of from about 50 to 90 mole percent based on total units of the Si-polymer.

Less preferred for at least particular applications and excluded from certain embodiments of the invention are Si-polymers that have relatively lower content of aqueous base-solubilizing groups such as less than about 40, 30, 20 or 15 mole percent of aqueous base-solubilizing groups based on total repeat units of an Si-polymer.

For use in chemically-amplified positive-acting photoresists, particularly preferred polymers of the invention contain one or more photoacid-labile groups, i.e. groups that undergo reaction in the presence of photogenerated acid to provide a polar group such as carboxy, hydroxy and the like. Preferred photoacid-labile groups include photoacid-labile esters or acetal groups.

Preferred polymers of the invention also may contain units that are free of photoacid-labile groups and aqueous-solubilizing groups, e.g. groups that are free of photoacid-labile ester or acetal moieties, or hydroxy, carboxy or sulfonic acid moieties. Preferred repeat units of this type include carbocyclic aryl (e.g. phenyl or naphthyl) or alkyl (inclusive of alkylidene and other branched groups) groups that are not substituted with such photoacid-labile or aqueous, alkaline solubilizing moieties, e.g. alkyl, phenyl or naphthyl groups that are either unsubstituted or substituted by one or more halo, unsubstituted alkyl, non-photoacid labile alkoxy, mesyl or other sulfonic esters such as those of the formula $C_{1-8}$alkylSO$_3$-and the like.

In a yet further aspect of the invention, substituted Si-sulfonamide and Si-thio compounds are provided as well as polymers that comprise those compounds. These compounds may form effective aqueous base-solubilizing units when incorporated into a polymer. Preferred sulfonamide compounds are halogenated, particularly fluorinated e.g. groups such as —CH$_2$F, —CHF$_2$, —CF$_3$, —CH$_2$CF$_3$, —CF$_2$CF$_3$, and the like. Preferred Si-thio compounds comprise one or more alkylsulfide moieties, e.g. one or more C1-12alkyl sulfide groups such as those of the formula —(CH$_2$)$_m$S(CH$_2$)$_n$CH$_3$ and —(CH$_2$)$_m$SH where in those formulae m and n are each independently an integer from 0 to 8.

Particularly preferred substituted sulfonamide and thio Si-polymer units include those of the following formulae (I) and (II):

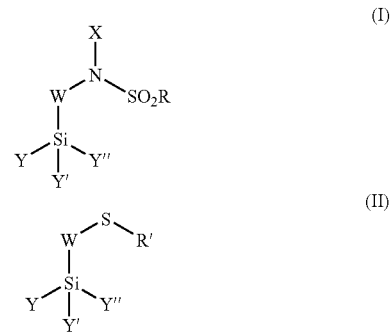

wherein in those formulae (I) and (II), Y, Y' and Y" are each independently a chemical bond to another polymer, hydrogen or a non-hydrogen substituent such as hydroxy, optionally substituted $C_{1-20}$alkyl (includes cycloalkyl such as norbornyl or adamantyl), optionally substituted carbocyclic aryl such as optionally substituted phenyl or naphthyl and the like;

each W is a linker, e.g. a chemical bond, an optionally substituted carbocyclic aryl such as optionally substituted phenyl, naphthyl or anthracene, an optionally substituted alkyl such as optionally substituted $C_{1-20}$alkyl (includes cycloalkyl such as norbornyl or adamantyl), and the like;

R is a non-hydrogen substituent such as optionally substituted alkyl, particularly halogenated alkyl e.g. $C_{1-20}$alkyl (includes cycloalkyl such as norbornyl or adamantyl) that has one or more halogen atoms such as fluorine e.g.—CH$_2$F, —CHF$_2$, —CF$_3$, —CH$_2$CH$_2$F, —CH$_2$CF$_3$, and the like, or an option ally substituted carbocyclic aryl such as optionally substituted phenyl or naphthyl, and the like;

X is hydrogen or a non-hydrogen substituent such as $C_{1-20}$alkyl (includes cycloalkyl) particularly methyl or ethyl, optionally substituted carbocyclic aryl such as optionally substituted phenyl; and R$^1$ is hydrogen or a non-hydrogen substituent such as optionally substituted alkyl, particularly $C_{1-20}$alkyl (includes cycloalkyl such as norbornyl or adamantyl) that may be optionally substituted e.g. by $C_{1-8}$alkoxy, has one or more halogen atoms such as fluorine e.g. R$^1$ may be —CH$_2$F, —CHF$_2$, —CF$_3$, —CH$_2$CH$_2$F, —CH$_2$CF$_3$, and the like, or R$^1$ may be an optionally substituted carbocyclic aryl such as optionally substituted phenyl or naphthyl, and the like.

It should be appreciated that in preferred groups, a sulfonamide or thio group is not directly covalently bonded to an Si atom, but rather one or more other atoms are interposed therebetween.

As mentioned, Si-polymers of the invention are particularly useful as a resin component of a photoresist composition. Typical photoresist compositions of the invention will contain a photoactive component, e.g. one or more photoacid generator compounds. Chemically-amplified positive-acting photoresists will contain a component that preferably has one or more photoacid-labile deblocking groups. Such photoacid-labile group(s) suitably will be substituents of the silicon-containing resin, but the resist also may contain a separate component such as a separate oligomer or polymer that contains such photoacid-labile group(s). Negative-acting resists of the invention typically will contain an agent for crosslinking of one or more of the components of the resist, typically a separate crosslinker component such as an amine-based reagent, e.g. a melamine or benzoguanamine resin. Resins used in negative-acting photoresists preferably contain primary or secondary alcohol moieties.

Si-polymers of the invention may be employed in photoresists imaged at nsub-200 nm wavelengths such as 193 nm or 157 nm, and thus preferably will be substantially free of any phenyl or other aromatic groups. For example, preferred polymers for such sub-200 nm imaging contain less than about 5 mole percent aromatic groups based on total units of the polymer, more preferably less than about 1 or 2 mole percent aromatic groups, still more preferably less than about 0.1, 0.02, 0.04 or 0.08 mole percent aromatic groups based on total units of the polymer. Particularly preferred polymers for 193 nm or 157 nm imaging are completely free of aromatic groups.

Polymers of the invention also may be suitably utilized in resists imaged at higher wavelengths, such as wavelengths less than 300 nm, particularly 248 nm. Such polymers suitably will contain aromatic groups such as provided by polymerization of an aromatic group, e.g. a phenyl group substituted with a trichlorosilyl group, trialkoxysilyl, and the like.

Photoresists of the invention are preferably employed in multilayer lithography systems. More particularly, preferred uses of resists of the invention include application of a first organic polymer coating on a substrate, e.g. a microelectronic wafer, and applying thereover a photoresist of the invention. The organic bottom layer suitably may be non-photoimageable (e.g. not contain a photoacid generator compound) but is thermally crosslinked prior to application of the resist layer. The bottom layer may comprise a phenolic polymer such as a novolac admixed with a thermal acid generator compound and a crosslinker. Use of such a bottom layer can enable application of a very thin top resist layer.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate, optoelectronic device substrate or liquid crystal display substrate or other flat panel display substrate having coated thereon a polymer, photoresist or resist relief image of the invention. The invention also includes methods to produce such articles of manufacture, which comprise use of a photoresist of the invention.

Other aspects of the invention are disclosed infra.

DETAILED DESCRIPTION OF THE INVENTION

As discussed above, we now provide a silicon polymers that have controlled ratio of OH moieties:Si atoms and/or a controlled amount of alkaline aqueous-solubilizing groups.

As referred to herein, the term "silanol" designates a hydroxy group (—OH) that is directly linked to an Si atom, i.e. no atoms are interposed between a covalent bond linking the hydroxy oxygen and the Si atom.

Preferred polymers of the invention include those that have minimal aromatic content and are employed in photoresist compositions that are imaged with sub-200 nm radiation such as 193 nm or 157 nm radiation.

Generally preferred polymers of the invention include those that contain Si atoms as a component of the polymer backbone, e.g. Si—O linkages, rather than a polymer that does not contain Si atoms as part of the backbone or substantial part thereof, but rather as pendant groups. More particularly, preferred polymers include those where at least 5 percent of the total number of atoms in the polymer backbone are Si atoms, or where at least about 10, 15, 20, 25, 30, 35, 40, 45, or 50 percent of the total number of atoms in the polymer backbone are Si atoms.

Preferred polymers of the invention include those that are formed from polymerization of a silyl halide or silyl alkoxide, particularly a silyl trihalide or trialkoxy silane such as reagent of the formula R—Si(halide)$_3$ e.g. R—Si(Cl)$_3$. The R moiety suitably may be aromatic (e.g. phenyl or naphthyl) or non-aromatic such as an optionally substituted alkyl or alicyclic groups such as norbornyl, adamantyl or the like. Such R groups may be substituted by a photoacid-labile group e.g. acid-labile ester such as t-butyl ester or acetal group, or an acetal group, or by aqueous base-solubilizing groups such as a fluorinated alcohol, sulfonamide, thiol, or the like.

Preferred polymers of the invention include those that comprise a structure of the following formula (III):

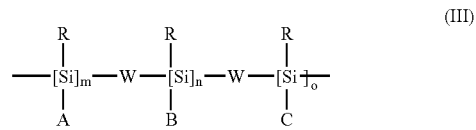

(III)

wherein each R is the same or different and is hydrogen or a non-hydrogen substituent such as another Si atom, oxygen, hydroxy (to thereby provide a silanol moiety), optionally substituted C$_{1-8}$alkyl, optionally substituted phenyl, and the like;

A comprises a photoacid-labile moiety such as a photoacid-labile ester or acetal group;

B comprises an aqueous base-solubilizing group such as a fluorinated alcohol, sulfonamide, thiol, and the like;

C is a group that is free of any hydroxy, carboxy or other aqueous base-solubilizing groups or any photoacid-labile moieties, e.g. C is suitably a C$_{1-20}$ alkyl group (including cycloalkyl) that is free of any hydroxy, carboxy or photoacid-labile moieties, or a phenyl or other carbocyclic aryl group that is free of any hydroxy, carboxy or photoacid-labile moieties;

m, n and o are mole percents of the respective units based on total polymer units;

m is greater than zero and less than 70 percent, preferably between 1 and 50 mole percent, still more preferably between 5 and 40 mole percent;

n is greater than zero and less than 70 mole percent, preferably between 2 and 40 mol percent, more preferably between 5 or 10 and 30 mole percent; and o is suitably from zero to 50 mole percent, more preferably from zero to about 10, 20, 30 or 40 mole percent.

More particularly, preferred units of polymer of the invention include the following groups 1 through 8; the lines from each Si atom indicate chemical bonds to further hydrogen or non-hydrogen substituents.

1. Aqueous-base Solubilizing Groups:

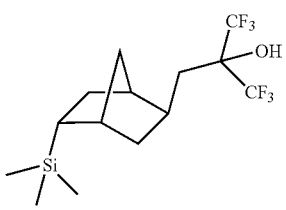

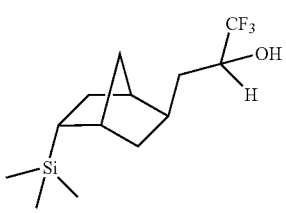

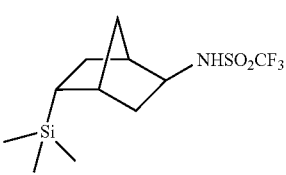

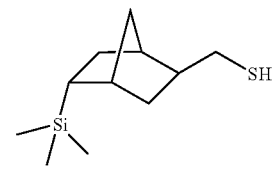

2. Photoacid-labile Groups:

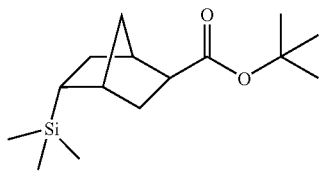

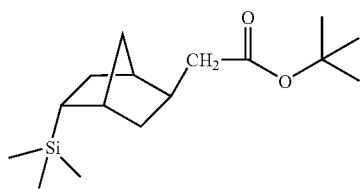

3. "Inert" Groups (i.e. Groups that are Free of any Hydroxy, Carboxy or Other Aqueous Base-solublizing Groups or any Photoacid-labile Groups):

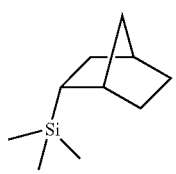

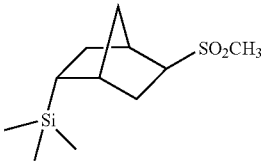

Exemplary preferred polymers comprise a structure of the following formula (IV):

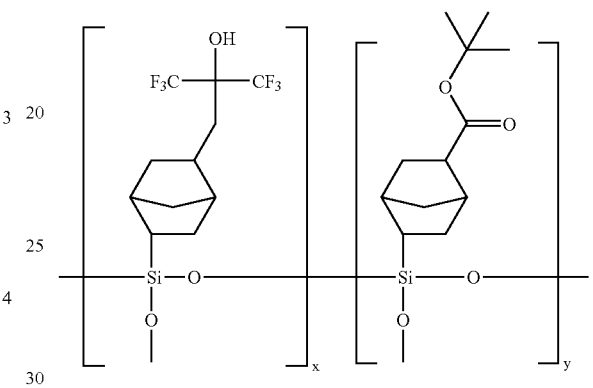

where in that formula (III) x is suitably from about 10 to about 90 mole percent based on total units of the polymer, and preferably x is from about 40 to about 80 mole percent based on total units of the polymer; and y is suitably from about 10 to about 80 mole percent based on total units of the polymer, and preferably y is from about 10 to about 50 mole percent, more preferably about 10 to about 30 or about 40 mole percent based on total units of the polymer. Preferably, the sum of x and y is at least about 70 or 80 mole percent based on total polymer units (i.e. the depicted units constitute at least about 70 or 80 mole percent of all polymer units), more preferably the sum of x and y is at least 90, 95 or 98 mole percent or 100 mole percent of total polymer units.

As mentioned above, preferred photoacid-labile groups of polymers of the invention include photoacid-labile ester or acetal groups, such as may be grafted onto —OH groups.

For instance, a haloacetate reagent such as tert-butyl chloroacetate ($ClCH_2CO_2C(CH_3)_3$) may be reacted with a hydroxy moiety such as a phenolic hydroxy. A carbonate reagent also may be reacted with a hydroxy moiety to provide pendant photoacid-labile esters, e.g. di-tert-butyl dicarbonate ($O[CO_2C(CH_3)_2]_2$) may be reacted with polymer hydroxy groups to provide pendent acid-labile ester groups. Reactions of such haloacetate or dicarbonate reagents may be suitably conducted under either acidic or basic conditions such as in the presence of potassium t-butoxide or N,N-dimethylaminopyridine. Basic reaction conditions are generally preferred.

A vinyl ether compound also suitably may be grafted onto a polymer hydroxy moiety to provide a photoacid-labile acetal group, e.g. a compound having at least one —(CH=CH)—O— groups such as ethylvinyl ether, t-amylvinyl ether, t-butylvinyl ether, vinylisobutyl vinyl ether, vinylpropyl ether, vinyl-2-ethylhexyl ether, vinyloctadecyl ether, and the like, as well as compounds that have two vinyl groups such as hydroxybutylvinyl ether, butanediol-1,4-divinyl ether, cyclohexylvinyl ether, hexanedioldivinyl ether, and the like, as well as compounds having three vinyl groups such triethyleneglycol divinyl ether, diethyleneglycol monovinyl ether, and the like, as well as compounds having 4 or more vinyl groups such as 1,4-cyclohexanoldimethanoldivinyl ether, propenyl ether of propylene carbonate, 1,1,1-tris(vinyloxymethyl)ethane, cyclohexanedimethanolmonovinyl ether, and the like.

Suitably, to provide acetal photoacid-labile groups, such vinyl ether compounds may be grafted onto a hydroxy group (e.g. a phenolic group or alcohol group such as $C_{1-12}$hydroxyalkyl) under acidic conditions preferably after dissolving the hydroxy-containing compound and the vinyl ether reagent in a suitable solvent such as one or more of acetone, tetrahydrofuran, diglyme and dioxane. Suitable acid catalysts to use to provide acidic conditions include hydrochloric acid, sulfuric acid, malonic acid and/or a sulfonic acid. Preferably, the molar ratio of free hydroxyl groups to the vinyl ether compound does not exceed 1 to 1, and more preferably the hydroxyl groups are present in a molar excess (e.g. 2:1) relative to the vinyl ether compound. In particular, a preferred synthesis includes grafting vinyl ether onto a preformed Si polymer having hydroxy groups, where only a portion of the polymer hydroxy groups are blocked with photoacid-labile groups and a portion of the polymer hydroxy groups remain unblocked as aqueous, alkaline developable groups.

Preferred repeat units that can contribute to aqueous developability of a photoresist containing the polymer include hydroxy, carboxy and other polar preferably acidic groups such as sulfonic acid and the like. For instance, a preferred repeat unit of this type is a hydroxy-containing unit, such as a phenolic unit, or an alcohol unit. However, for at least many preferred aspects of the invention, references herein to aqueous base-solubilizing groups or other similar term does not include a group containing a silanol moiety.

In such copolymers, units that are free of photoacid-labile and aqueous, alkaline developing groups will be free of moieties as discussed above, i.e. photoacid-labile ester or acetal moieties, or hydroxy, carboxy or sulfonic acid moieties. Preferred repeat units of this type include phenyl or alkyl groups that are not substituted with such photoacid-labile or aqueous, alkaline developing moieties; e.g. preferred repeat units of this type are alkyl (including cycloalkyl such as norbornyl) or phenyl groups that are either unsubstituted or substituted by one or more halo, unsubstituted alkyl, non-photoacid labile alkoxy, sulfonyl acid esters, and the like. Such substituents should be substantially stable (i.e. not undergoing a deblocking reaction) under typical lithographic conditions (e.g. pre-exposure thermal treatment of up to 140° C. for 1-2 minutes; exposure; post-exposure thermal treatment of up to about 160° C. for 1-2 minutes; and/or development with an aqueous, alkaline developer solution). Preferred substituents that are non-photoacid-labile and do not substantially promote aqueous developability useful for this type of repeat unit are disclosed as inert blocking groups in U.S. Pat. Nos. 5,736,536 and 5,541,263 both to Thackeray et al. of the Shipley Company. As disclosed in those patents, suitable substituents that are substantially inert to lithographic processing and do not substantially increase aqueous, alkaline developability of a resist containing the polymer include alkoxy groups such as methoxy, ethoxy, propoxy, n-butoxy, sec-butoxy, etc.; alkyl esters represented by RCOO— where R is preferably an alkyl group having 1 to 6 carbon atoms such as methyl, ethyl, propyl, isopropyl, butyl, etc.; sulfonyl acid esters include both alkyl (e.g. $C_{1-6}$alkyl) are carbocyclic aryl esters such as methane sulfonyl, ethane sulfonyl, propane sulfonyl, benzene sulfonyl, and toluene sulfonyl esters, etc. All those groups can be grafted onto hydroxy groups as discussed above to form sulfonyl esters, e.g. by reaction of an alkylhalide such alkylchloride to form an alkoxy group, or an acid halide such as acid chloride to form an alkylester.

Such Si polymers containing two or three distinct repeat can be readily prepared. For instance, a hydroxy-Si reagent can be polymerized such as a hydroxylalkyl silyl reagent. A formed hydroxy-Si polymer can be functionalized to provide multiple distinct repeat units, e.g. pendant hydroxy groups can be reacted to have both photoacid-labile groups (such as by reaction of a dicarbonate or a halocetate ester as discussed above) and non-photoacid-labile groups such as provided by reaction of a sulfonyl acid or acid chloride or the like. Preferably, those distinct groups are reacted sequentially with the pre-formed hydroxy Si polymer, although it is possible to make both additions to the pre-formed polymer in a single reaction sequence. Preferably, a portion of the hydroxy moieties are left unreacted (i.e. unsubstituted) to provide aqueous, alkaline developing enhancing OH groups.

In suitable copolymers, each distinct repeat units may be suitably present in a variety of relative amounts. For example, repeat units that have photoacid-labile groups suitably may be present in a polymer from about 1, 2 or 3 to about 60 or 70 mole percent, based on total repeat units of the polymer, more preferably about 5, 10 or 20 to about 30, 40 or 50 mole percent based on total units of the polymer. The repeat unit(s) that do not contain photoacid labile groups and do not substantially increase aqueous, alkaline developability (e.g. mesyl-substituted phenyl) suitably may be present in a polymer from about 1, 2 or 3 to about 50 or 60 mole percent, based on total repeat units of the polymer, more preferably about 5, 10 or 20 to about 30 or 40 or 50 mole percent based on total units of the polymer. The repeat units that increase aqueous, alkaline developability (such as alcohol units) suitably may be present in a polymer from about 10, 20 or 25 to about 30, 40 or 50 mole percent based on total units of the polymer, more preferably from about 10 to about 40 mole percent of aqueous base-solubilizing groups in the polymer based on total units of the polymer.

As mentioned above, preferred Si-polymers for use in a negative-acting resist composition will contain primary and secondary hydroxy moieties, suitably primary or second alcohol groups that may be present as hydroxy$C_{1-20}$alkyl groups. Such primary and secondary hydroxy can be effective sites or moieties for crosslinking.

Preferred polymer units for a polymer used in a negative-acting resist include those of the following formula (V):

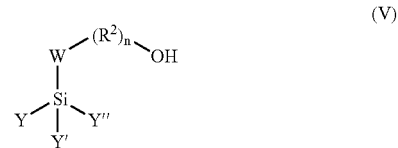

wherein in that formula (III, Y, Y' and Y" are each independently a chemical bond to another polymer, hydrogen or a non-hydrogen substituent such as hydroxy, optionally substituted $C_{1-20}$alkyl (includes cycloalkyl such as norbornyl or adamantyl), optionally substituted carbocyclic aryl such as optionally substituted phenyl or naphthyl and the like;

each W is a linker, e.g. a chemical bond, an optionally substituted carbocyclic aryl such as optionally substituted phenyl, naphthyl or anthracene, an optionally substituted alkyl such as optionally substituted $C_{1-20}$alkyl (includes cycloalkyl such as norbornyl or adamantyl), and the like; and $R^2$ is optionally substituted alkylene (including branched alkylene) suitably having from 1 to about 12 carbon atoms;

n is 0 (where $R^2$ is not present) or n is 1;

wherein W or $R^2$ provide a primary or secondary carbon that is covalently linked to the depicted hydroxyl.

Preferred polymers of the invention may be prepared as generally exemplified in Examples 1 through 4 which follow.

Thus, for instance, Example 3 below exemplifies preparation of a substituted sulfonamide silyl reagent (trihalide silyl reagent) through reaction of an unsaturated alkyl amine with a substituted sulfonyl chloride to form an unsaturated substituted sulfonamide. $HSiCl_3$ is then reacted across the carbon-carbon double bond of the formed unsaturated sulfonamide preferably in the presence of a metal catalyst such as a Pt catalyst and at elevated temperature, e.g. at reflux temperature of an aromatic solvent such as toluene or xylene. The formed trihalide silyl reagent then can be reacted with other silyl reagents to form Si-polymer with substituted sulfonamide groups, as exemplified in Example 3 below and discussed above.

A thiol silyl reagent (e.g. trihalide silyl reagent) can be formed by similar procedures. For instance, an unsaturated alkyl sulfide e.g. allyl mercaptancan be reacted with $HSiCl_3$ preferably in the presence of a metal catalyst such as a Pt catalyst and at elevated temperature, e.g. at reflux temperature of an aromatic solvent such as toluene or xylene. The trichlorosilyl reagent will add SiCl3 to an unsaturated carbon. The formed trihalide silyl reagent then can be reacted with other silyl reagents to form Si-polymer with thio moieties.

As mentioned above, various groups of Si-compounds and Si-polymers may be optionally substituted, including groups of the above formulae (I), (II), (III) and (V). A group that is optionally substituted refers to the specified moiety that may be substituted at one or more available positions by one or more suitable groups such as, e.g., halogen such as fluoro, chloro, bromo and iodo; cyano; hydroxyl; nitro; azido; alkanoyl such as a $C_{1-6}$ alkanoyl group such as acyl and the like; carboxamido; alkyl groups including those groups having 1 to about 12 carbon atoms or from 1 to about 6 carbon atoms and more preferably 1-3 carbon atoms; alkenyl and alkynyl groups including groups having one or more unsaturated linkages and from 2 to about 12 carbon or from 2 to about 6 carbon atoms; alkoxy groups having those having one or more oxygen linkages and from 1 to about 12 carbon atoms or 1 to about 6 carbon atoms; aryloxy such as phenoxy; alkylthio groups including those moieties having one or more thioether linkages and from 1 to about 12 carbon atoms or from 1 to about 6 carbon atoms; alkylsulfinyl groups including those moieties having one or more sulfinyl linkages and from 1 to about 12 carbon atoms or from 1 to about 6 carbon atoms; alkylsulfonyl groups including those moieties having one or more sulfonyl linkages and from 1 to about 12 carbon atoms or from 1 to about 6 carbon atoms; and the like.

Photoimageable compositions of the invention are preferably used in multiple-layer systems, i.e. where the photoimageable composition is disposed over a further organic (polymer composition) layer that itself is disposed over a substrate surface such as a microelectronic wafer or device substrate or an optical waveguide substrate.

Preferred underlayer compositions include those that comprise a phenolic polymer such as a novolak and/or poly(vinylphenol). Also preferred is where the underlying polymer composition is a crosslinking composition, e.g. contain an acid or acid generator compound such as a thermal acid generator compound and preferably a separate crosslinker component such as an amine-based material, e.g. a melamine or benzoguanamine resin. For such crosslinking composition, the applied underlayer may be crosslinked prior to application of the overcoated photoimageable composition, e.g. by suitable thermal treatment such as heating at 140° C., 150° C., 160° C., 180° C., 200° C. or 230° C. for a time sufficient for crosslinking such as 0.5, 1 or 2 minutes. The underlying polymer composition is suitably non-photoimageable and does not contain a photoacid generator compound.

Suitably, more than one silicon-containing polymer may be used in the present photoimageable compositions. Thus, the present photoimageable compositions may include one, two or more silicon-containing polymers. When two or more silicon-containing polymers are used, at least one is a silicon-containing polymer of the present invention. The remaining silicon-containing polymers may be conventional silicon-containing polymers or polymers of the present invention. In this way, blends of polymers may be advantageously used in the present photoimageable compositions. Such blends include blends of the present silicon-containing polymers with non-silicon-containing polymers. In these blends, any ratio of polymers is suitable. The specific ratio will depend upon the particular polymers combined and the characteristics (dissolution rate, etch resistance, photospeed, etc.) desired and are within the ability of one skilled in the art.

A wide variety of photoactive components may be used in the present invention, including, but not limited to, photoacid generators and photobase generators. Photoacid generators are preferred. It will be appreciated by those skilled in that art that more than one photoactive component may be used advantageously in the photoimageable compositions of the present invention.

The photoacid generators useful in the present invention are any compounds which liberate acid upon exposure to activating radiation, e.g. sub-300 nm radiation such as 248 nm, or sub-200 nm radiation such as 193 nm or 157 nm. Suitable photoacid generators include e.g. halogenated triazines, onium salts, sulfonated esters and halogenated sulfonyloxy dicarboximides.

Particularly useful halogenated triazines include halomethyl-s-triazines. Suitable halogenated triazines include for example, 2-(1-(3,4-benzodioxolyl))-4,6-bis(trichloromethyl)-1,2,5-triazine, 2-(1-(2,3-benzodioxolyl))-4,6-bis(trichloromethyl)-1,3,5-triazine, 2-(1-(3,4-benzodioxolyl))-4,6-bis(tribromomethyl)-1,3,5-triazine, 2-(1-(2,3-benzodioxolyl))-4,6-bis(tribromomethyl)-1,3,5-triazine, 2-(2-furfylethylidene)-4,6-bis(trichloromethyl)-1,3,5-triazine, 2-(2-(5-methylfuryl)ethylidene)-4,6-bis(trichloromethyl)-1,3,5-triazine, 2-(2-(4-methylfuryl)ethylidene)-4,6-bis(trichloromethyl)-1,3,5-triazine, 2-(2-(3-methylfuryl)ethylidene)-4,6-bis-(trichloromethyl)-1,3,5-triazine, 2-(2-(4,5-dimethylfuryl)ethylidene)-4,6-bis(trichloromethyl)-1,3,5-triazine, 2-(2-(5-methoxyfuryl)ethylidene)-4,6-bis(trichloromethyl)-1,3,5-triazine, 2-(2-(4-methoxyfuryl)ethylidene)-4,6-bis(trichloromethyl)-1,3,5-triazine, 2-(2-(3-methoxyfuryl)ethylidene)-4,6-bis (trichloromethyl)-1,3,5-triazine, 2-(2-(4,5-dimethoxy-furyl)ethylidene)-4,6-bis(trichloromethyl)-1,3,5-triazine, 2-(2-furfylethylidene)-4,6-bis(tribromomethyl)-1,3,5-triazine, 2-(2-(5-methylfuryl)ethylidene)-4,6-bis(tribromomethyl)-1,3,5-triazine, 2-(2-(4-methylfuryl)-ethylidene)-4,6-bis(tribromomethyl)-1,3,5-triazine, 2-(2-(3-methylfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2-(2-(5-methoxyfuryl)ethylidene)-4,6-bis(tribromomethyl)-1,3,5-triazine, 2-(2-(4-methoxyfuryl)ethylidene)-4,6-bis(tribromomethyl)-1,3,5-triazine, 2-(2-(3-methoxyfuryl)ethylidene)-4,6-bis(tribromomethyl)-1,3,5-triazine, 2-(2-(4,5-dimethoxyfuryl)ethylidene)-4,6-bis(tribromomethyl)-1,3,5- triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924-30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference. Sulfonium salts such as triphenylsulfonium hexafluorophosphate are preferred.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3, 337-340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbornene-2,3-dicarboximide; N-((trifluoromethylsulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1H-isoindole-1,3 (2H)-dione; 2-(((trifluoromethyl)sulfonyl)oxy)-1H-benz(f)isoindole-1,3(2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3 (2H)-dione; 2-(((trifluoromethyl)sulfonyl)oxy)-1H-benz(de)isoquinoline-1,3(2H)-dione; 4,5,6,7-tetrahydro-2-(((trifluoromethyl)sulfonyl)oxy)-1H-isoindole-1,3(2H)-dione; 3a,4,7,7a-tetrahydro-2-(((trifluoromethyl)sulfonyl)oxy)-4,7-epoxy-1H-isoindole-1,3(2H)-dione; 2,6-bis-(((trifluoromethyl)sulfonyl)oxy)-benzo(1,2-c:4,5-c')dipyrrole-1,3,5,7(2H,6H)-tetrone; hexahydro-2,6-bis-(((trifluoromethyl)sulfonyl)oxy)-4,9-methano-1H-pyrrolo(4,4-g)isoquinoline-1,3,5,7(2H,3aH,6H)-tetrone; 1,8,8-trimethyl-3-(((trifluoromethyl)sulfonyl)oxy)-3-azabicyclo(3.2.1)octane-2,4-dione; 4,7-dihydro-2-(((trifluoromethyl)sulfonyl)oxy)-4,7-epoxy-1H-isoindole-1,3(2H)-dione; 3-(1-naphthalenyl)-4-phenyl-1-(((trifluoromethyl)sulfonyl)oxy)-1H-pyrrole-2,5-dione; 3,4-diphenyl-1-(((trifluoromethyl)sulfonyl)oxy)-1H-pyrrole-2,5-dione; 5,5'-(2,2,2-trifluoro-1-(trifluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f)isoindole-3,5(1 aH,4H)-dione; 5,5'-oxybis-2-(((trifluoromethyl)sulfonyl)oxy)-1H-isoindole-1,3 (2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboximides comprise one or more of 1 (((trifluoromethyl)sulfonyl)oxy)-1H-pyrrole-2,5-dione; N-((perfluorooctanesulfonyl)oxy)-5-norbornene-2,3-dicarboximide; N-((trifluoromethylsulfonyl)oxy)-5-norbornene-2,3-dicarboximide and 1-(((trifluoromethyl)sulfonyl)oxy)-2,5-pyrrolidinedione, and more preferably N-((perfluorooctanesulfonyl)oxy)-5-norbornene-2,3-dicarboximide or N-((trifluoromethylsulfonyl)oxy)-5-norbornene-2,3-dicarboximide.

In positive-acting systems of the present invention, the photoactive components are typically added to photoimageable compositions in an amount sufficient to generate a latent image in a coating layer of resist material upon exposure to activating radiation. When the photoactive component is a photoacid generator, the amount is typically in the range of 0.1 to 15 percent by weight, based on the weight of the resin, and preferably 1 to 8 percent by weight.

In negative-acting systems of the present invention, the amount of photoactive component useful is any amount sufficient to catalyze cross-linking of the silicon-containing polymer or oligomer. The photoactive components are typically used in the range of 0.1 to 25% by weight, based on the weight of the composition. It is preferred that the photoactive component is present in an amount in the range of 0.1 to 1.5% by weight, more preferably in the range of 0.1 to 12% by weight, and still more preferably less than or equal to 5% by weight. A particularly suitable range is from 0.1 to 5% by weight.

Negative-acting resist preferably include one or more cross-linking agents. Any aromatic or aliphatic cross-linking agent that reacts with the silicon-containing polymer or oligomer is suitable for use in the present invention. Such organic cross-linking agents will cure to form a polymerized network with the silicon-containing polymer or oligomer, and reduce solubility in selected solvents. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to: amine containing compounds, epoxy containing materials, compounds containing at least two vinyl ether groups, allyl substituted aromatic compounds, and combinations thereof. Preferred cross-linking agents include amine containing compounds and epoxy containing materials.

The amine containing compounds useful as cross-linking agents in the present invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are the preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl. Depending upon the reaction conditions and the concentration of formaldehyde, the methyl ethers may react with each other to form more complex units.

Particularly suitable amine-based cross-linking agents include those of formula (VI):

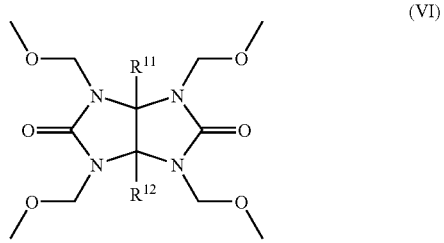

wherein $R^{11}$ and $R^{12}$ are independently selected from H, ($C_1$-$C_6$)alkyl and phenyl. Preferred alkyl groups for $R^{11}$ and $R^{12}$ are methyl and propyl.

Epoxy containing materials useful as cross-linkers in the present invention are any organic compounds having one or more oxirane rings that are polymerizable by ring opening. Such materials, broadly called epoxides, include, but are not limited to: monomeric epoxy compounds, and polymeric epoxides that may be aliphatic, cycloaliphatic, aromatic or heterocyclic. Preferred epoxy cross-linking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Suitable substituents include, but are not limited to: halogens, ester groups, ethers, sulfonate groups, siloxane groups, nitro groups, phosphate groups, and the like.

Particularly useful epoxy containing materials in the present invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Such glycidyl ethers include bisphenol A epoxides, such as bisphenol A ethoxylated diepoxide. Further examples of epoxides of this type are described in U.S. Pat. No. 3,018,262, herein incorporated herein by reference to the extent this patent teaches the preparation of such epoxides.

Suitable epoxides useful in the present invention include, but are not limited to: epichlorohydrin, glycidol, glycidyl-methacrylate, the glycidyl ether of p-tertiarybutylphenol (e.g., those available under the trade name EPI-REZ 5014 from Celanese); diglycidyl ether of Bisphenol A (e.g., those available under the trade designations EPON 828, EPON 1004 and EPON 1010 from Shell Chemical Co.; and DER-331, DER-332 and DER-334 from Dow Chemical Co.), vinylcyclohexene dioxide (e.g., ERL-4206 from Union Carbide Corp.), 3,4-epoxy-6-methyl-cyclohexylmethyl-3,4-epoxy-6-methylcyclohexene carboxylate (e.g., ERL-4201 from Union Carbide Corp.), bis(3,4-epoxy-6-methylcyclohexylmethyl) adipate (e.g., ERL-4289 from Union Carbide Corp.), bis(2,3-epoxycyclopentyl) ether (e.g., ERL-0400 from Union Carbide Corp.), aliphatic epoxy modified with polypropylene glycol (e.g., ERL-4050 and ERL-4269 from Union Carbide Corp.), dipentene dioxide (e.g., ERL-4269 from Union Carbide Corp.), flame retardant epoxy resins (e.g., DER-580, a brominated bisphenol type epoxy resin available from Dow Chemical Co.), 1,4-butanediol diglycidyl ether of phenol-formaldehyde novolak (e.g., DEN-431 and DEN-438 from Dow Chemical Co.), and resorcinol diglycidyl ether (e.g., KOPOXITE from Koppers Company, Inc.).

Compounds containing at least two vinyl ether groups include, but are not limited to divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

Suitable allyl substituted aromatic compounds useful as cross-linkers in the present invention are those containing one or more allyl substituents, that is, the aromatic compound is substituted at one or more ring positions by the allylic carbon of an alkylene group). Suitable allyl aromatics include allyl phenyl compounds, such as an allyl phenol. An allyl phenol crosslinker can be a monomer or polymer that contains one or more phenol units where the phenol units are substituted at one or more ring positions by an allylic carbon of an alkylene group. Typically the alkylene substituent(s) is propenyl, i.e., the phenol has one or more propenyl substituents. Preferred allyl phenols include a polycondensate of phenol and hydroxybenzaldehyde and an allylhalide such as allylchloride. A number of suitable allyl phenols are commercially available, for example the allyl phenol sold under the trade name THERMAX SH-150AR by Kennedy and Klim, Inc. (Little Silver, N.J.). Allyl phenyl compounds including allyl phenols are also described in U.S. Pat. No. 4,987,264, herein incorporated by reference to the extent this patent teaches the preparation of such compounds.

Particularly suitable organic cross-linking agents include those containing one or more methoxymethyl groups, such as methoxymethyl-substituted melamines and methoxymethyl-substituted glycourils such as those of formula IV, above. Hexamethoxymethylmelamine is a preferred methoxymethyl-substituted melamine. It is further preferred that one or more of the hydrogens of the organic cross-linking agent, and more preferably one or more of the methyl hydrogens in the methoxymethyl substituent, is substituted with a halogen, preferably fluorine. Thus, preferred cross-linkers include those containing one or more methoxyfluoromethyl and/or methoxydifluoromethyl substituents. Exemplary preferred fluorinated cross-linking agents include methoxyfluoromethyl- and methoxydifluoromethyl-substituted melamines and glycourils, such as hexamethoxyfluoromethylmelamine and hexamethoxydifluoromethylmelamine. Also suitable are fluorinated epoxy cross-linking agents. For certain applications, it is preferred that the cross-linking agent is fluorinated.

The compositions of the present invention may suitably comprise only a single type of organic cross-linker, e.g., only an amine containing cross-linker, or may contain two or more different cross-linkers. When a combination of organic cross-linkers is used in the present invention, it is preferred that the combination include an amine containing compound and an epoxy containing compound. The concentration of organic cross-linking agents in the compositions of the present invention may vary within a relatively wide range. It will be appreciated by those skilled in the art that suitable organic cross-linker concentrations will vary with factors such as cross-linker reactivity and specific application of the composition. Typically, the cross-linking agent(s) is present in an amount in the range of 0.1 to 80% by weight, based on the total weight of the composition, preferably in the range of 0.5 to 50%, and more preferably in the range of 1 to 25%. It is preferred that a cross-linking agent is used in the compositions of the present invention.

The photoimageable compositions of the present invention may optionally further include one or more additional components, including, but not limited to, solvents, anti-striation agents, plasticizers, surfactants, base additives, speed enhancers, fillers, dyes and the like. In positive-acting systems, a base additive is typically used to adjust the photospeed of the composition. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

The photoimageable compositions of the present invention may be readily prepared by those skilled in the art. For example, a photoresist composition of the invention can be prepared by dissolving the components of the photoresist, i.e. polymer binder and photoactive component, in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof.

Typically, the solids content of the photoresist composition varies from about 5 to about 35 percent by weight, based on the total weight of the composition. The resin binder and photoactive components should be present in amounts sufficient to provide a film coating layer and formation of good quality latent and relief images.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

As discussed above, the present photoimageable compositions are particularly suitable for use as a top layer in a bilayer photoresist system. As also discussed above, in such a system, a bottom layer of a conventional photoresist, such as novolac polymer based resist, inert polyarylether-sulfone copolymer based resist or a novolac or polyhydroxystyrene-based thermally cross-linkable system. Such bottom layer is typically applied to or coated on a substrate using any of the above described procedures. The bottom layer is then hard baked such as at 230° C. for 2 minutes, after which the present photoimageable compositions are coated on the cured bottom layer. The bottom layers preferably contain an amount of a UV absorbing component, such as an anthracene dye, sufficient for optical density and etch performance. The bottom layers typically have a thickness of from 0.4 to 1 µm. The top layer of the present photoimageable compositions is typically from 0.05 to 1 µm thick, preferably from 0.1 to 0.5 µm, and more preferably from 0.1 to 0.3 µm.

After being coated on the bottom layer, the present photoimageable composition top layer is dried by heating (baked) to remove any solvent. It is preferably dried until the coating is tack free. Thereafter, it is imaged through a mask in a conventional manner. The exposure is sufficient to effectively activate the photoactive component of the photoresist to produce a patterned image in the resist coating layer, and more specifically, the exposure energy typically ranges from about 1 to 100 mJ/cm$^2$, dependent upon the exposure tool and the components of the photoresist composition.

The photoimageable compositions of the present invention may be activated by a variety of exposure wavelengths, such as 248, 193, 157 nm and 11-15 nm. However, the photoimageable compositions of the present invention may be used with other radiation sources, such as, but not limited to, visible, e-beam, ion-beam and x-ray.

Following exposure, the film top layer of the composition is preferably baked at temperatures ranging from about 70° C. to 160° C. Thereafter, the top layer film is developed to form an etch pattern. The exposed resist film is rendered positive working by employing a polar developer, preferably an aqueous based developer, such as quaternary ammonium hydroxide solutions, such as tetra-alkyl ammonium hydroxide, preferably a 0.15 to 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

The pattern is next transferred to the underlayer or bottom layer by etching, such as with an oxygen reactive ion etch process. After such processing, the resists, both top and bottom layers, may be removed from the processed substrate using any stripping procedures known in the art.

The present photoimageable compositions are useful in all applications where photoresists are typically used. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass, spin-on organic dielectrics, spin-on or chemical vapor deposited inorganic dielectrics, and the like are also suitable employed as substrates for the photoresist compsitions of the invention. Other chemical vapor deposited layers, such as cap layers, etch stops and the like, may also be used as substrates.

Alternatively, the present compositions may also be used in optoelectronics applications, such as in the manufacture of optical waveguides. By "optical waveguide" is meant any device that transmits optical radiation across a two-dimensional substrate surface. Suitable optical waveguides include, but are not limited to, splitters, couplers, spectral filters, polarizers, isolators, wavelength division multiplexing structures, and the like. Such waveguides may also contain active functionality, such as amplification and switching such as with electro-optic, thermo-optic or acousto-optic devices. To be useful as amplifiers, the present waveguides typically contain one or more dopants. Erbium is an exemplary dopant. Such dopants are well known in the art. Thus, the present waveguides suitable for use as amplifiers contain one or more dopants.

The waveguides of the present invention may be manufactured as individual waveguides or as an array of waveguides. Whether such waveguides are prepared as an array depends on the particular use and is within the ability of one skilled in the art.

In one embodiment, optical waveguides may be prepared by first disposing a layer of the present compositions on a substrate by any means including, but not limited to, screen coating (or screen printing), curtain coating, roller coating, slot coating, spin coating, flood coating, electrostatic spray, spray coating, dip coating or as a dry film. When the compositions of the present invention are spray coated, a heated spray gun may optionally be used. The viscosity of the composition may be adjusted to meet the requirements for each method of application by viscosity modifiers, thixotropic agents, fillers and the like. Any substrate suitable for supporting a waveguide may be used with the present compositions. Suitable substrates include, but are not limited to, substrates used in the manufacture of electronic devices such as printed wiring boards and integrated circuits. Particularly suitable substrates include laminate surfaces and copper surfaces of copper clad boards, printed wiring board inner layers and outer layers, wafers used in the manufacture of integrated circuits, liquid crystal display ("LCD") glass substrates and the like.

The coated substrate is typically then cured, such as by baking, to remove any solvent. Such curing may be a variety of temperatures, depending upon the particular solvent chosen. Suitable temperatures are any that are sufficient to substantially remove any solvent present. Typically, the curing may be at any temperature from room temperature (i.e., 25° C.) to 170° C. Such curing typically occurs over a period of from 5 seconds to 30 minutes. Such curing may be affected by heating the substrate in an oven or on a hot plate.

After curing, the layer of the present composition disposed on the substrate is then imaged by exposure to actinic radiation through appropriate artwork or a mask. Following exposure, the composition is then cured at a temperature of from 40° to 170° C. Curing time may vary but is generally from about 30 seconds to about 1 hour. While not intending to be bound by theory, it is believed that upon exposure to actinic radiation the silsesquioxane oligomer cross-links, particularly with the optional cross-linking agent. The exposed areas are rendered less soluble than the unexposed areas. Thus, the unexposed areas may be removed, such as by contact with a suitable solvent, aqueous developer or solvent-water mixture, leaving only the exposed areas remaining on the substrate. Suitable aqueous developers include alkali metal hydroxides such as sodium hydroxide and potassium hydroxide in water as well as tetraalkylammonium hydroxide in water. Such developers are typically used in concentrations from 0.1 to 0.3 N, such as 0.15 to 0.26 N tetramethylammonium hydroxide in water. The choice of developer is well within the ability of those skilled in the art. Such development may be at a variety of temperatures such as from room temperature to about 100° C. The time of such development depends upon the material to be removed and the temperature used, but is generally from about 10 seconds to about 1 hour.

Following development, the present waveguides may undergo a final cure step, or re-flow step. In such final cure step, the waveguides may be heated at a temperature in from about 130° to 225° C. in air or inert atmospheres such as nitrogen or argon. Such final cure step aids in removal of residual solvent, removal of hydroxyl groups from the silsesquioxane polymer such as by increasing the extent of cross-linking, alter the waveguide profile such as to reduce surface roughness, and improves the optical transmission properties of the material.

Optical waveguides typically have a core and a cladding, wherein the cladding has a lower index of refraction as compared to the core. Particularly useful waveguides have core having an index of refraction of from 1.4 to 1.55. Typically, suitable cladding has an index of refraction of from 1.3 to 1.54.

It is preferred that a cladding layer is first deposited on a substrate. If the cladding layer is photocurable or thermocurable, it may be blanket cured as a first step. The photodefinable core material is then deposited on the cladding layer, imaged and the unexposed areas optionally removed. A second cladding layer is then deposited on the imaged waveguide. The second cladding layer may be the same or different from the first cladding layer. However, the indices of refraction of the first and second cladding layers should be the same. The second cladding layer is then cured, or imaged in the case of a photocurable cladding composition, to provide a waveguide structure.

The Si oligomers and polymers of the present invention are suitable for use in the cladding and/or core of the present optical waveguides. Preferably, the present photodefinable compositions are used to prepare cores for optical waveguides. It will be appreciated that the refractive index of a photodefinable composition including a present Si oligomer and one or more organic cross-linking agents may be modified by changing the amount and type of the one or more cross-linking agents selected and/or photoactive component. Thus, the present compositions may be useful as core or cladding material depending upon the type and quantity of cross-linking agents selected.

In an alternate embodiment, the present compositions may be used to make porous optoelectronic devices, such as porous core and/or cladding materials in waveguides. Such porous optoelectronic devices may be prepared according to the same methods used to prepare porous dielectric materials.

All documents mentioned herein are incorporated herein by reference. The following non-limiting examples are illustrative of the invention.

EXAMPLE 1

Polymer Synthesis

The following polymer was prepared as shown in the following Scheme.

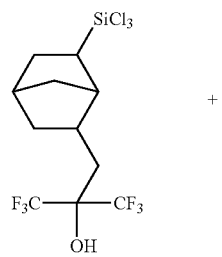

Mol. Wt.: 409.65

A

75

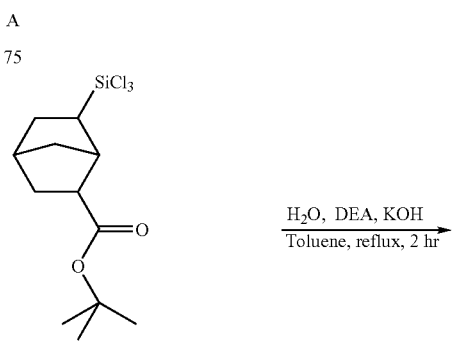

Mol. Wt.: 329.72

B

25

$\xrightarrow[\text{Toluene, reflux, 2 hr}]{\text{H}_2\text{O, DEA, KOH}}$

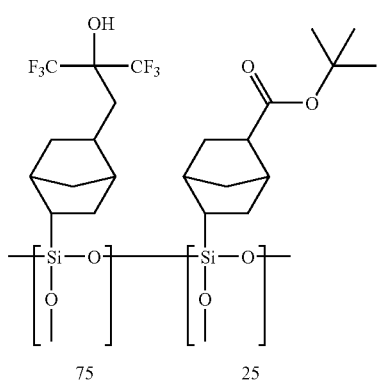

75   25

A reaction vessel was charged as follows:

| Monomer A: | 15.36 g (0.0375 mol) |
|---|---|
| Monomer B: | 4.11 g (0.0125 mol) |
| Toluene: | 40 g (46 ml) |
| DI Water: | 16.8 g |
| Diethylamine: | 10.97 g (15.5 ml) |
| KOH: | 0.21 g |

More specifically, to a 250 ml 3 necked round-bottom flask fitted with a thermometer and an addition funnel, gas inlet was added the solution of DEA (11 g), DI water (16.8 g) and toluene (10 ml). The flask temperature was between 0 to −5° C. To this chilled solution was added a mixture of the monomers (A and B as specified immediately above) and toluene (40 g) drop wise over a period of 55 min. (Note: at 0° C., there were two phases: a milky white bottom layer and a clear toluene top layer). After the addition was complete the whole mixture was allowed to come to RT and stirred for additional 1.5 hr. The two layers were separated by addition of extra water to dissolve the quaternary ammonium salt (observation: apart from the two layers, an oily white material was found in the flask which was not soluble in water as well as in toluene at room temperature. However the oily materials dissolved completely in toluene when it was heated to 50° C.) The toluene layer was washed with DI water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~200 ml) fitted with a thermometer, Dean-Stark trap and a condenser. To the total solution was added 0.21 g of KOH dissolved in 1 ml DI water followed by 1.0 ml of DI water rinse. The mixture was heated to reflux to azeotrope water that was added to the reaction and formed during condensation. The reflux was continued for 2 hr (Note: during reflux, removed toluene (10 mL)/water (3 mL) mixture from the Dean Stark condenser). After 2 hr reflux, the solution was brought into RT and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight. The final polymer was analyzed by various techniques such as: $^1$H, $^{13}$C and $^{29}$Si NMR, GPC-PDA, DSC, TGA, Base content, FT-IR, MALDI-TOF.

The number of OH (silanol) group per silicon atom was calculated by using $^{29}$Si NMR and was found to be found to be 0.2.

EXAMPLE 2

Preparation of Polymer B

Experimental procedure for the preparation of soluble polysilsesquioxane using Template method) is as follows (Scheme I):

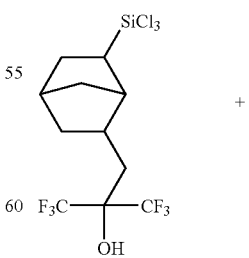

A

70

-continued

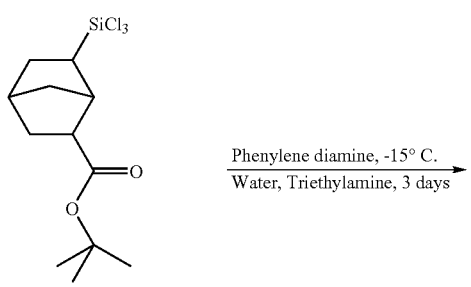

B

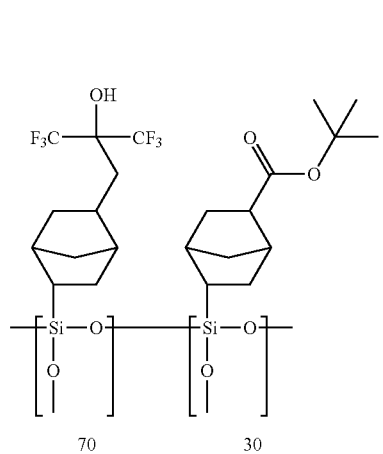

A reaction vessel was charged as follows:

| | |
|---|---|
| Monomer A: | 10.4 g (0.036 mol) |
| Monomer B: | 34.0 g (0.084 mol) |
| Phenylenediamine: | 6.9 g |
| Triethylamine: | 36 mL |
| Tetrahydrofuran: | 260 mL |
| Toluene: | 150 mL |
| DI Water: | 4.3 mL |

A solution of 6.9 g of 1,4-phenylenediamine, 12 ml of triethylamine and 160 ml of THF was added drop wise to a three necked flask containing 10.4 g of monomer A and 34.0 g of monomer B in 150 ml of toluene at −15° C. This solution was stirred for 30 min at low temperature (−15° C.) after which 4.3 ml of water and 24 ml of triethylamine and 100 ml of THF were added drop wise to the flask at −5° C. This mixture was stirred at this temperature for additional 3 h then washed with water until neutral and dried with anhydrous sodium sulfate overnight. The final solution from the above reaction was stirred in the presence of molecular sieves (4A) and a 1 ml of triethylamine at 50° C. for 72 h. After 72 h, the polymer solution was washed with water until neutral and the solvent was distilled off. The solid polymer was dissolved in minimum amount of THF and precipitated in water (twice) and dried in vacuum at 50° C. for 24 h. The final polymer was analyzed by various techniques such as: $^1$H, $^{13}$C and $^{29}$Si NMR, GPC-PDA, DSC, TGA, Base content, FT-IR, MALDI-TOF.

The number of OH (silanol) group per silicon atom was calculated by using $^{29}$Si NMR and was found to be found to be 0.8.

EXAMPLE 3

Sulfonamide Based Copolymers for 193 nm Bilayer Application

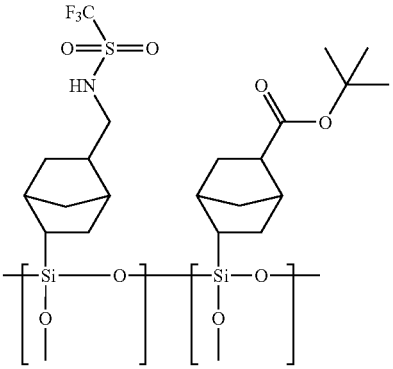

Synthesis of Monomer A:

All reaction glassware was dried in the oven overnight at 100° C. The glassware was set up and cooled under a stream of nitrogen. The reaction was carried out under a blanket of nitrogen.

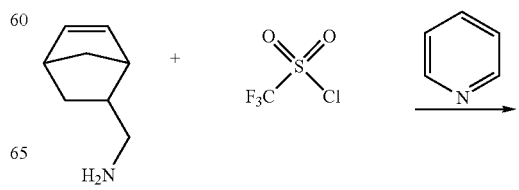

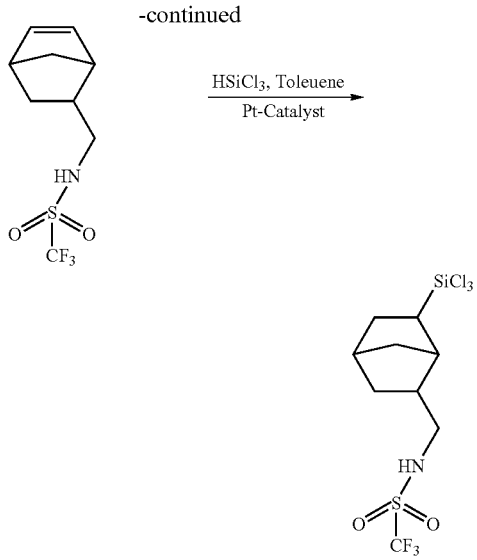

Into a dry 250 ml 3 necked flask quipped with a magnetic stirrer, condenser and an addition funnel was added 80 ml dry tetrahydrofuran, 9.7 g of pyridine and 12.3 g of Norbornene amine. The reaction mixture was cooled to 0° C. and 16.9 g of trifluoromethanesulfonylchloride was added to this mixture and stirred for 4 h. After stirring for 4 h, the pyridinium salt was filtered off and the THF was evaporated to dryness. The resulting solid was dissolved in diethylether and washed with 3.5% HCl followed by DI water till the pH 7. The ether was dried over sodium sulphate and evaporated the solvent to get an oily product. The product was analyzed by 1H, 13C and 19F NMR and it was further hydrosilylated by the following procedure:

A 100 ml 2 necked round bottomed flask quipped with refluxing condenser and an addition funnel flushed with nitrogen for 10 min and charged 200 mg of platinum-divinyltetramethyldisiloxane complex and 25 ml of toluene. The mixture was stirred at room temperature. 10.0 g of the above mixture was added (all at once) to this clear solution followed by the drop wise addition of 20 g of trichlorosilane (total addition time ~10 min) at room temperature. The whole mixture was stirred at 50° C. for 48 h, after which the solvent and the unreacted starting materials were distilled off. The crude product was subjected to $^1$H & $^{13}$C NMR (yield >95%).

Polycondensation Reaction:

To a 250 ml 3 necked Rb flask fitted with a thermometer and an addition funnel, gas inlet was added the solution of DEA (11 g), DI water (16.8 g) and toluene (10 ml). The flask temperature was between 0 to −5° C. To this chill solution was added a mixture of the monomers (A and B) and toluene (40 g) drop wise over a period of 55 min. (Note: at 0° C., there were two phases: a milky white bottom layer and a clear toluene top layer). After the addition was complete the whole mixture was allowed to come to RT and stirred for additional 1.5 hr. The two layers were separated by addition of extra water to dissolve the quart. amm. Salt (Observation: apart from the two layers, an oily white material was found in the flask which was not soluble in water as well as in toluene at room temperature. However the oily materials dissolved completely in toluene when it was heated to 50° C. The toluene layer was washed with DI water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~200 ml) fitted with a thermometer, Dean-Stark trap and a condenser. To the total solution was added 0.21 g of KOH dissolved in 1 ml DI water followed by 1.0 ml of DI water rinse. The mixture was heated to reflux to azeotrope water that was added to the reaction and formed during condensation. The reflux was continued for 2 hr (Note: during reflux, removed toluene (10 mL)/water (3 mL) mixture from the Dean Stark condenser). After 2 hr reflux, the solution was brought into RT and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight.

EXAMPLE 4

Polymer Particularly Suitable for Negative Bilayer Application

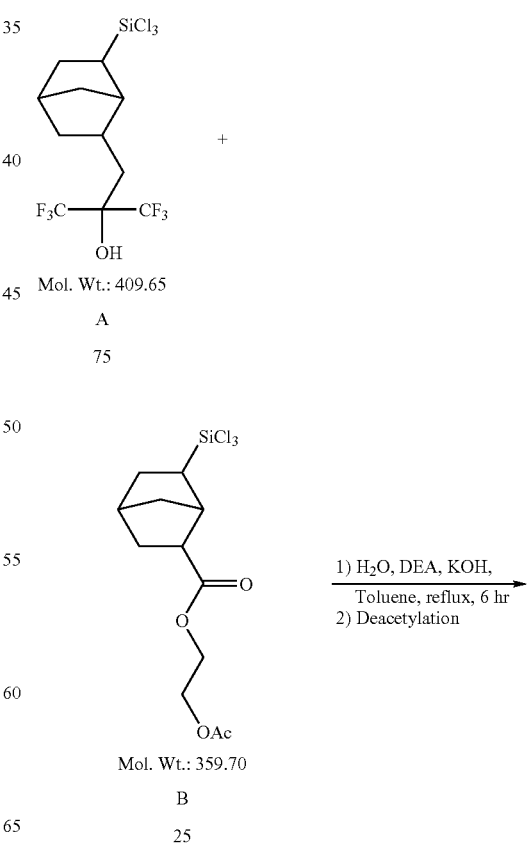

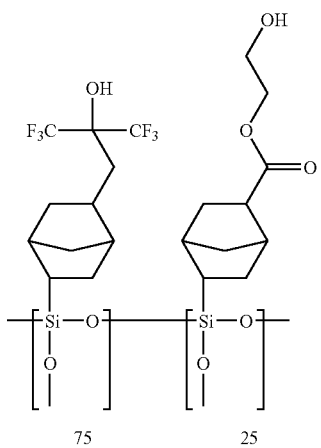

| Material | Amt (g) | Amt (ml) | Moles | Source |
|---|---|---|---|---|
| 3-(5-bicyclo[2.2.1]hepten-2-yl)-1,1,1-trifluoro-2-(trifluoromethyl)propan-2-ol | 50 | | 0.182 | Central Glass |
| Trichlorosilane | 100 | ~75 | 0.738 | Gelest |
| Toluene | | 175 | | |
| Pt(divinyltetramethyl) disiloxane complex | | 5 drops | | |

All reaction glassware was dried in the oven overnight at 100C. The glassware was set up and cooled under a stream of nitrogen. The reaction was carried out under a blanket of nitrogen.

To a 500 ml 3N-RB flask fitted with a gas inlet, thermometer, overhead stirrer, condenser and a glass stopper was added 50 g 3-(5-bicyclo[2.2.1]hepten-2-yl)-1,1,1-trifluoro-2-(trifluoromethyl)propan-2-ol 100 ml of toluene and the catalyst. To this solution was added the trichlorosilane followed by the remainder of the toluene (75 ml). The mixture was heated to 50-51C using a heating mantel. The reaction was held at 50-51C for 36 hours. The reaction was cooled to room temperature and the excess trichlororsilane and toluene were removed under reduced pressure leaving 67 g of a crude oil. The product was purified by high vacuum distillation to give 63.3 g of product (74C/<1 mm).

Monomer B was also prepared by the same procedure.

| Polycondensation Reaction: | |
|---|---|
| Charge: | |
| A | 19.88 g (0.04852 mole) |
| B | 5.99 g (0.01665 mole) |
| Toluene | 60 ml |
| Acetone | 5 ml |
| DI Water | 34 g |
| Diethylamine | 22 g; |
| KOH: | 0.4 g in 3 ml water |

To a 250 ml 3 necked Rb flask fitted with a thermometer and an addition funnel, gas inlet was added the solution of DEA (22 g), DI water (34 g) and toluene (10 ml). The flask temperature was between 0 to −5° C. To this chilled solution was added a mixture of the monomers (A and B) and toluene (50 g) drop wise over a period of 55 min. (Note: at 0° C., there were two phases: a milky white bottom layer and a clear toluene top layer). After the addition was complete the whole mixture was allowed to come to RT and stirred for additional 1.5 hr. The two layers were separated by addition of extra water to dissolve the quart. amm. Salt The toluene layer was washed with DI water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~175 ml) fitted with a thermometer, Dean-Stark trap and a condenser. To the total solution was added 0.4 g of KOH dissolved in 2 ml DI water followed by 1.0 ml of DI water rinse. The mixture was heated to reflux to azeotrope water that was added to the reaction and formed during condensation. The reflux was continued for 4 hr (Note: during reflux, removed toluene/water mixture from the Dean Stark condenser). After 4 hr reflux, the solution was brought into RT and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight. The deprotection of acetyl group from one of the monomers was carried by refluxing the copolymer in presence of dilute ammonium hydroxide solution for 24 hr. The final polymer was characterized by $^1$H, $^{13}$C & $^{29}$Si NMR, GPC-PDA, DSC, TGA, Base content, FT-IR, MALDI-TOF MS.

| NBTFE silane monomer Synthesis | | | | |
|---|---|---|---|---|
| Material | Amt (g) | Amt (ml) | Moles | Source |
| 1-Bicyclo[2.2.1]hept-5-en-2-yl-2,2,2-trifluoro-ethanol | 22 | | 0.114 | JM-4000-61 |
| Trichlorosilane | 50 | ~36.5 | 0.368 | Gelest |
| Toluene | | 75 | | |
| Pt(divinyltetramethyl) disiloxane complex | 0.15 | | | |

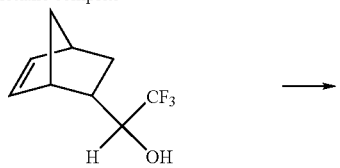

1-Bicyclo[2.2.1]hept-5-en-2-yl-2,2,2-trifluoro-ethanol

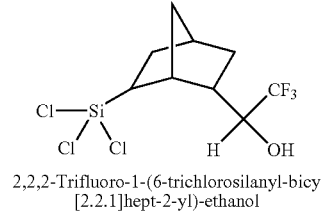

2,2,2-Trifluoro-1-(6-trichlorosilanyl-bicy[2.2.1]hept-2-yl)-ethanol

All reaction glassware was dried in the oven overnight at 100C. The glassware was set up and cooled under a stream of nitrogen. The reaction was carried out under a blanket of nitrogen.

To a 300 ml 3N-RB flask fitted with a gas inlet, thermometer, overhead stirrer, condenser and a glass stopper was added 22 g 1-Bicyclo[2.2.1]hept-5-en-2-yl-2,2,2-trifluoro-ethanol, 75 ml of toluene and the catalyst. To this solution was added the trichlorosilane. The mixture was heated to 50-51C using a heating mantel. The reaction was held at 50-51C for 72 hours. The reaction was cooled to room temperature and the excess trichlororsilane and toluene were removed under reduced pressure leaving 34 g of a crude oil. NMR indicated all the staring material was consumed. Theoretical yield-37.3

EXAMPLE 5

Photoresist Preparation and Lithographic Processing

A photoresist composition was prepared as follows. A homogeneous resist solution was obtained by mixing 94.86 parts of the Si polymer prepared in Example 1, 4.50 parts of triphenylsulfonium perfluorobutanesulfonate, 0.54 parts of Troeger's base and 0.1 parts of a surfactant with 660 parts of 2-heptanone. The thus prepared resist formulation was filtered through a 0.10 μm Teflon filter and applied by spin coating to a thickness of 1000±15 Å onto a phenolic underlayer composition layer. The applied photoresist coating layer was soft baking at 120° C. for 60 seconds. The underlayer composition layer had been applied by spin coating onto a silicon wafer to a thickness of 5100 Å using a 60 second bake at 250° C.

The applied resist layer was exposed to 193 nm radiation using an ISI Microstepper (0.60NA, 0.70σ) through a binary photomask using conventional illumination. Wafers were subjected to a post-exposure bake at 120° C. for 60 seconds and subsequently developed in LDD-26W developer using a 60 second single puddle process without pre-wetting. As a result, a resist pattern exhibiting 120 nm 1:1 trenches on was obtained.

EXAMPLE 6

Photoresist Preparation from Polymer B and Lithographic Processing

A photoresist composition was prepared as follows. A homogeneous resist solution was obtained by mixing 94.86 parts of the Si polymer prepared in Example 2, 4.50 parts of triphenylsulfonium perfluorobutanesulfonate, 0.54 parts of Troeger's base and 0.1 parts of a surfactant with 660 parts of 2-heptanone. The thus prepared resist formulation was filtered through a 0.10 μm Teflon filter and applied by spin coating to a thickness of 1000±15 Å onto a phenolic underlayer composition layer. The applied photoresist coating layer was soft baking at 120° C. for 60 seconds. The underlayer composition layer had been applied by spin coating onto a silicon wafer to a thickness of 5100 Å using a 60 second bake at 250° C.

The applied resist layer was exposed to 193 nm radiation using an ISI Microstepper (0.60NA, 0.70σ) through a binary photomask using conventional illumination. Wafers were subjected to a post-exposure bake at 120° C. for 60 seconds and subsequently developed in LDD-26W developer using a 60 second single puddle process without pre-wetting. As a result, a resist prepared from polymer B exhibited no imaging as the resist film was washed off of the wafer. This was attributed to the high silanol content (0.8 Si—OH/Si) in combination with high hexafluoro alcohol content (70 mol %).

The foregoing description of the invention is merely illustrative thereof, and it is understood that variations and modifications can be made as set forth in the following claims.

What is claimed is:

1. A positive-acting photoimageable composition comprising a photoactive component and a polymer component,
the polymer component comprising a polymer that comprises Si atoms and silanol groups,
wherein the polymer has a ratio of silanol groups to Si atoms of about 0.15 to 0.4,
and the polymer comprises one or more moieties select from the group consisting of fluorinated alcohol, sulfonamide, carboxylic acid and/or thiol.

2. The photoimageable composition of claim 1 wherein the polymer contains at least about 20 mole percent of fluorinated alcohol, sulfonamide, carboxylic acid and/or thiol moieties based on total units of the polymer.

3. The photoimageable composition of claim 1 wherein the polymer contains at least about 50 mole percent fluorinated alcohol, sulfonamide, carboxylic acid and/or thiol moieties based on total units of the polymer.

4. The photoimageable composition of claim 1 wherein the polymer comprises units that are free of photoacid-labile groups and.

5. The photoimageable composition of claim 1 wherein the polymer comprises at least two distinct repeat units.

6. The photoimageable composition of claim 1 wherein the composition is a chemically-amplified positive acting photoresist.

7. A coated substrate comprising:
a) a polymer composition coating layer applied over a substrate surface;
b) a coating layer of a photoimageable composition of claim 1 disposed over the polymer composition coating layer.

8. A coated substrate of claim 7 wherein the polymer composition does not contain a polymer with Si groups.

9. A coated substrate of claim 7 wherein the polymer composition is not photoimageable.

10. A method for forming a electronic device, comprising:
(a) applying on a substrate a coating layer of a polymer composition;
(b) over the polymer composition coating layer, applying a photoimageable composition of claim 1;
(c) exposing the photoimageable composition coating layer to activating radiation and developing the exposed photoimageable layer.

11. The method of claim 10 wherein a coating layer of the photoimageable composition coating layer is exposed with radiation having a wavelength of about 248 nm.

12. The method of claim 10 wherein a coating layer of the photoimageable composition coating layer is exposed with radiation having a wavelength of less than about 200 nm.

13. The method of claim 10 wherein a coating layer of the photoimageable composition coating layer is exposed with radiation having a wavelength of about 193 nm or 157 nm.

14. The method of claim 10 wherein the substrate is a silicon wafer.

15. The photoimageable composition of claim 1 wherein the polymer comprises one or more moieties select from the group consisting of fluorinated alcohol and carboxylic acid.

16. The photoimageable composition of claim 1 wherein the polymer comprises one or more moieties selected from the group consisting of sulfonamide and thiol.

17. A positive-acting photoimageable composition comprising a photoactive component and a polymer component,
the polymer component comprising a polymer that comprises Si atoms and silanol groups,
wherein the polymer has a ratio of silanol groups to Si atoms of about 0.05 to 0.4,
and the polymer comprises one or more moieties select from the group consisting of sulfonamide and thiol.

* * * * *